US009006835B2

(12) United States Patent
Kronholz et al.

(10) Patent No.: US 9,006,835 B2
(45) Date of Patent: Apr. 14, 2015

(54) TRANSISTOR WITH EMBEDDED SI/GE MATERIAL HAVING REDUCED OFFSET AND SUPERIOR UNIFORMITY

(71) Applicant: GLOBALFOUNDRIES Inc., Grand Cayman (KY)

(72) Inventors: Stephan Kronholz, Dresden (DE); Peter Javorka, Radeburg (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/074,905

(22) Filed: Nov. 8, 2013

(65) Prior Publication Data

US 2014/0131805 A1    May 15, 2014

Related U.S. Application Data

(62) Division of application No. 13/006,148, filed on Jan. 13, 2011, now Pat. No. 8,609,498.

(30) Foreign Application Priority Data

Jun. 30, 2010    (DE) .......................... 10 2010 030 768

(51) Int. Cl.
*H01L 27/088* (2006.01)
*H01L 21/8238* (2006.01)
*H01L 29/78* (2006.01)
*H01L 29/66* (2006.01)

(52) U.S. Cl.
CPC ...... *H01L 27/088* (2013.01); *H01L 21/823807* (2013.01); *H01L 21/823814* (2013.01); *H01L 29/665* (2013.01); *H01L 29/66636* (2013.01); *H01L 29/7834* (2013.01); *H01L 29/7848* (2013.01)

(58) Field of Classification Search
USPC .................... 257/368, 256, 18, 19
See application file for complete search history.

(56) References Cited

U.S. PATENT DOCUMENTS

| 6,949,482 | B2 | 9/2005 | Murthy et al. | 438/933 |
|---|---|---|---|---|
| 7,405,131 | B2 | 7/2008 | Chong et al. | 438/300 |
| 7,554,110 | B2 | 6/2009 | Yu et al. | 257/369 |
| 2009/0230480 | A1* | 9/2009 | Shifren et al. | 257/369 |
| 2010/0090289 | A1 | 4/2010 | Yang et al. | 257/369 |

FOREIGN PATENT DOCUMENTS

DE    112004002409 T5    10/2006

OTHER PUBLICATIONS

Translation of Official Communication from German Patent Office for German Patent Application No. 10 2010 030 768.8 dated May 3, 2011.

* cited by examiner

*Primary Examiner* — Long Pham
(74) *Attorney, Agent, or Firm* — Amerson Law Firm, PLLC (57) ABSTRACT

A semiconductor device includes a first transistor positioned in and above a first semiconductor region, the first semiconductor region having a first upper surface and including a first semiconductor material. The semiconductor device further includes first raised drain and source portions positioned on the first upper surface of the first semiconductor region, the first drain and source portions including a second semiconductor material having a different material composition from the first semiconductor material. Additionally, the semiconductor device includes a second transistor positioned in and above a second semiconductor region, the second semiconductor region including the first semiconductor material. Finally, the semiconductor device also includes strain-inducing regions embedded in the second semiconductor region, the embedded strain-inducing regions including the second semiconductor material.

19 Claims, 7 Drawing Sheets

TRANSISTOR WITH EMBEDDED SI/GE MATERIAL HAVING REDUCED OFFSET AND SUPERIOR UNIFORMITY

CROSS-REFERENCE TO RELATED APPLICATIONS

This is a divisional of co-pending application Ser. No. 13/006,148, filed Jan. 13, 2011, which claimed priority from German Patent Application No. 10 2010 030 768.8, filed Jun. 30, 2010.

BACKGROUND OF THE INVENTION

1. Field of the Invention

Generally, the present disclosure relates to the fabrication of integrated circuits, and, more particularly, to transistors having strained channel regions by using embedded semiconductor alloys, such as silicon/germanium, to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability.

In addition to the continuous size reduction of the critical dimensions, i.e., the gate length of the transistors, requiring the adaptation and possibly the new development of highly complex process techniques, it has been proposed to enhance the channel conductivity of the transistor elements by increasing the charge carrier mobility in the channel region for a given channel length.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in conductivity. On the other hand, compressive strain in the channel region may increase the mobility of holes, thereby providing the potential for enhancing the performance of P-type transistors.

Consequently, it has been proposed to introduce, for instance, a silicon/germanium material next to the channel region to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although this technique provides significant advantages in view of performance gain of P-channel transistors and thus of complex CMOS devices, it turns out, however, that a further increase of the strain component in the channel region may be difficult to achieve by further reducing the lateral offset of the silicon/germanium alloy from the channel region without compromising integrity of the gate electrode structure, as will be described in more detail with reference to FIGS. 1a-1d.

Figure 1A:
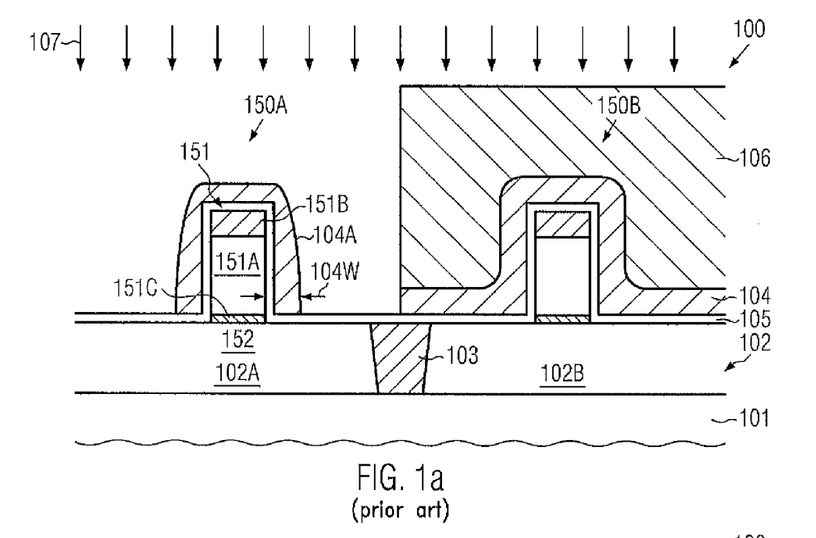
FIGS. 1a-1c schematically illustrate cross-sectional views of a conventional semiconductor device upon forming a strain-inducing semiconductor alloy on the basis of a substantially vertical cavity, according to conventional strategies.

FIG. 1a schematically illustrates a cross-sectional view of a conventional semiconductor device 100 at an early manufacturing stage. The semiconductor device 100 comprises a substrate 101, typically silicon substrates are used, above which may be formed a buried insulating layer (not shown), if a silicon-on-insulator (SOI) architecture is considered. Moreover, a silicon semiconductor layer 102 is formed above the substrate 101 and represents an active semiconductor material for forming therein and thereon circuit elements, such as transistors and the like. The semiconductor layer 102 comprises a plurality of active regions wherein, for convenience, a first active region 102A and a second active region 102B are illustrated in FIG. 1a, which are laterally separated by an isolation structure 103 provided in the form of a shallow trench isolation. The active region 102A is an appropriately doped semiconductor material for forming therein and thereabove a P-channel transistor 150A, while the active region 102B is appropriately configured in order to provide the basic characteristics for an N-channel transistor 150B. As illustrated, each of the transistors 150A, 150B comprises a gate electrode structure 151 including a gate electrode material 151A, a dielectric cap layer 151B formed above the gate electrode material 151A, and a gate insulation layer 151C, which separates the gate electrode material 151A from a channel region 152 in the corresponding active regions 102A, 102B. Furthermore, a spacer element 104A, also referred to as an offset spacer, is formed on sidewalls of the gate electrode structure 151 of the P-channel transistor 150A, possibly in combination with an etch stop liner 105, and the like. The N-channel transistor 150B is covered by a spacer layer 104, possibly in combination with the etch stop liner 105. Furthermore, an etch mask 106 is formed above the active region 102B, for instance in the form of a resist material and the like.

The semiconductor device 100 is typically formed on the basis of the following process techniques. After delineating the active regions 102A, 102B by forming the isolation structure 103 and performing appropriate implantation sequences in order to provide the basic doping in the active regions 102A, 102B, the gate electrode structures 151 are formed by providing an appropriate material for the gate insulation layer 151C followed by the deposition of a gate electrode material 151A and the dielectric cap material 151B. For this purpose, well-established oxidation, surface treatments and deposition techniques may be used, depending on the overall configuration of the gate electrode structures. During the patterning of these material layers, sophisticated lithography techniques and etch processes are used in order to obtain the gate electrode structures 151 with a desired gate length according to device requirements. Next, the etch stop liner 105, if required, may be formed by deposition and/or oxidation, followed by the deposition of the spacer layer 104, which is typically deposited as a silicon nitride material by using thermally activated chemical vapor deposition (CVD) recipes, plasma assisted processes and the like. When depositing the spacer layer 104, a thickness thereof is selected in view of a desired width 104W of the spacer element 104A, which in turn determines an offset of a silicon/germanium alloy to be formed in the active region 102A in a later manufacturing stage. Since the width 104W essentially determines the offset of a silicon/germanium material when applying substantially anisotropic etch recipes during the further processing, the width 104W is typically reduced in order to enhance the strain-inducing effect achieved by the silicon/germanium material. That is, for given deposition recipes and hence material compositions of the silicon/germanium material, the lateral offset of the strain-inducing material from the channel region 152 significantly influences the finally obtained strain and thus performance gain of the transistor 150A, in particular when extremely scaled devices are considered having gate lengths of 50 nm and significantly less. A reduced thickness of the spacer layer 104 may thus be desirable in view of a pronounced performance gain of the transistor 150A. On the other hand, the reduction in thickness is limited in view of preserving the integrity of the gate electrode materials 151A and of the gate insulation layer 151C, if, for instance, comprising very sensitive materials, such as high-k dielectric materials and the like. After forming the spacer layer 104 on the basis of a thickness that is a compromise between performance gain of the transistor 150A and integrity of the gate electrode structure 151, the etch mask 106 is formed on the basis of lithography techniques in order to cover the transistor 150B, i.e., the corresponding portion of the spacer layer 104, thereby selectively exposing the transistor 150A to an etch ambient 107 that is appropriately selected to remove material of the spacer layer 104, thereby forming the spacer element 104A. The etch process 107 is performed on the basis of well-established plasma assisted anisotropic etch techniques, wherein, if required, a control of the etch process may be accomplished on the basis of the etch stop liner 105. Thereafter, exposed portions of the liner 105 are removed and a further etch process or a further etch step of the process 107 is applied on the basis of appropriately selected etch parameters and an etch chemistry for etching into the active region 102A while using the spacer 104A and the isolation structure 103 as stop materials.

Figure 1B:
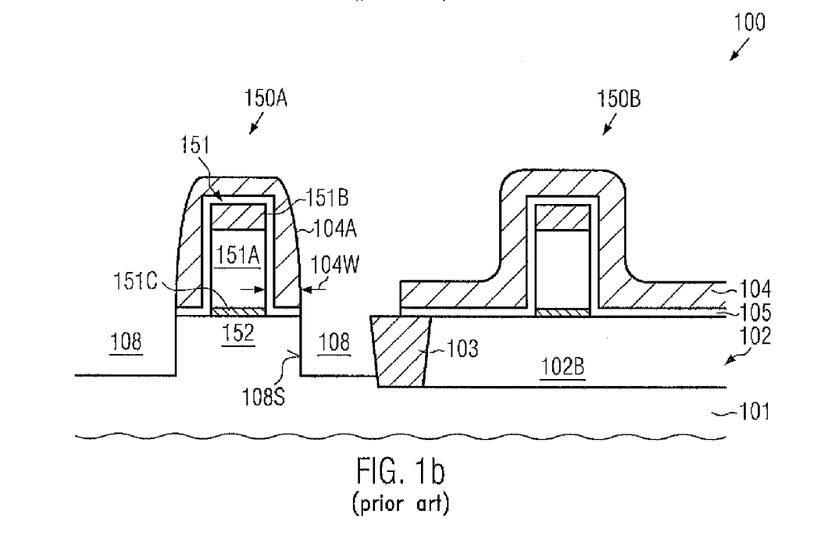

FIG. 1b schematically illustrates the semiconductor device 100 in a further advanced manufacturing stage, wherein cavities 108 are formed adjacent to the gate electrode structure 151 and the spacer element 104A within the active region 102A, wherein, due to the anisotropic nature of the preceding plasma assisted etch process, substantially vertical sidewalls 108S are obtained. Consequently, a lateral offset of the cavities 108, and thus of any silicon/germanium alloy still to be formed in a later manufacturing stage, from the gate electrode material 151A is substantially determined by the width 104W of the spacer 104A, possibly in combination with a thickness of the etch stop liner 105, if provided. Consequently, any process variation during the formation of the spacer element 104A and during the subsequent etch process for forming the cavities 108 may affect the resulting transistor characteristics, in particular for highly scaled critical dimensions of the transistors 150A, 150B. That is to say, upon further scaling the gate length of the transistors, any process flow variations, which may not proportionally scale down with the device dimensions, may thus provide an over-proportional effect on the finally obtained transistor characteristics.

Figure 1C:
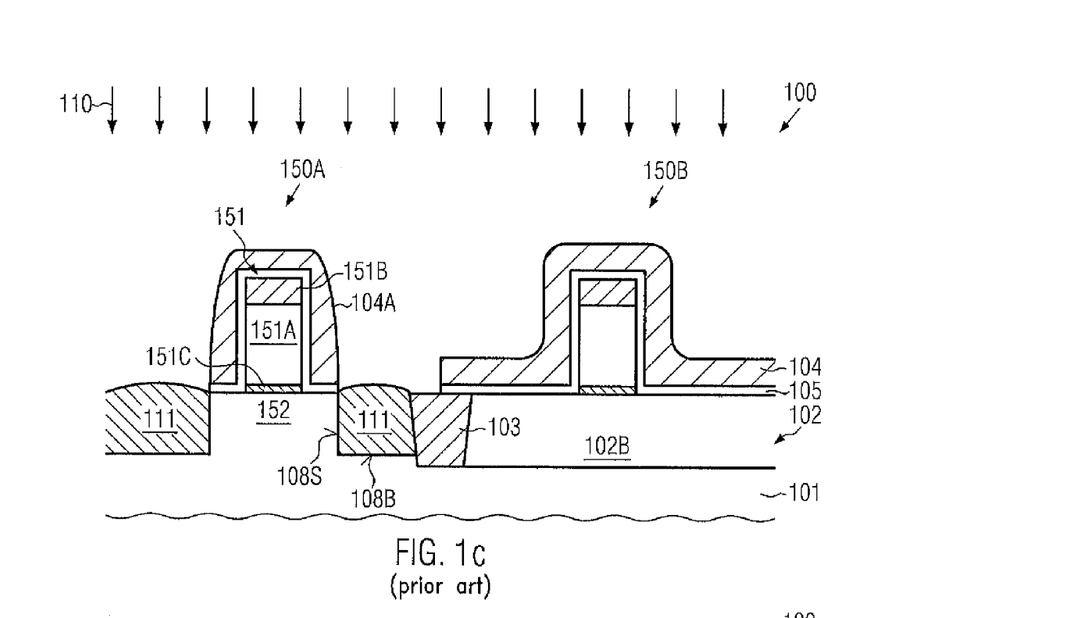

FIG. 1c schematically illustrates the device 100 during a selective epitaxial growth process 110, during which a silicon/germanium alloy 111 is formed in the cavities 108 (FIG. 1b), wherein process parameters are appropriately selected such that a significant material deposition may occur on exposed crystalline surface areas, while a deposition on dielectric materials is efficiently suppressed. It is well known that the process parameters, such as flow rates, deposition temperature and the like, may be selected such that a significant growth of material may be obtained on the exposed surface areas, which may represent more or less well-defined crystallographic planes due to the crystalline nature of the active regions 102A, 102B. For example, for a standard crystallographic configuration of the semiconductor layer 102, typically the sidewall 108S, when representing a substantially vertical sidewall, may thus represent a (110) crystal plane or any physical equivalent plane, while the bottom 108B may substantially represent a (100) crystal plane. The process parameters of the deposition process 110 may thus be selected such that a comparable deposition rate may be obtained for these crystallographic planes, while, in other crystallographic orientations, a significantly reduced deposition rate may occur, as is well known in the art.

Consequently, for a given germanium concentration, which may typically be restricted to values of 30 atomic percent and less, the spacer element 104A may substantially determine the resulting strain component in the channel region 152, wherein a further reduction of this offset may be difficult to achieve since the spacer 104A also has to preserve integrity of the gate electrode structure 151 during the preceding processing and during the further processing, for instance in view of complex cleaning steps and the like. Consequently, in addition to any process variations, the relative gain achieved by the incorporation of the embedded silicon/germanium material 111 may be increasingly reduced upon further scaling the transistor dimensions, since the width of the spacer element 104A may not be arbitrarily scaled down in a proportional manner.

In some conventional approaches, it has been suggested to introduce an isotropic etch process so as to obtain a certain degree of under-etching when forming the cavities 108, which, however, may also cause significant process variations and may result in reduced gate integrity, in particular at the edges of the gate electrode structure, depending on the lateral etch rate.

Figure 1D:
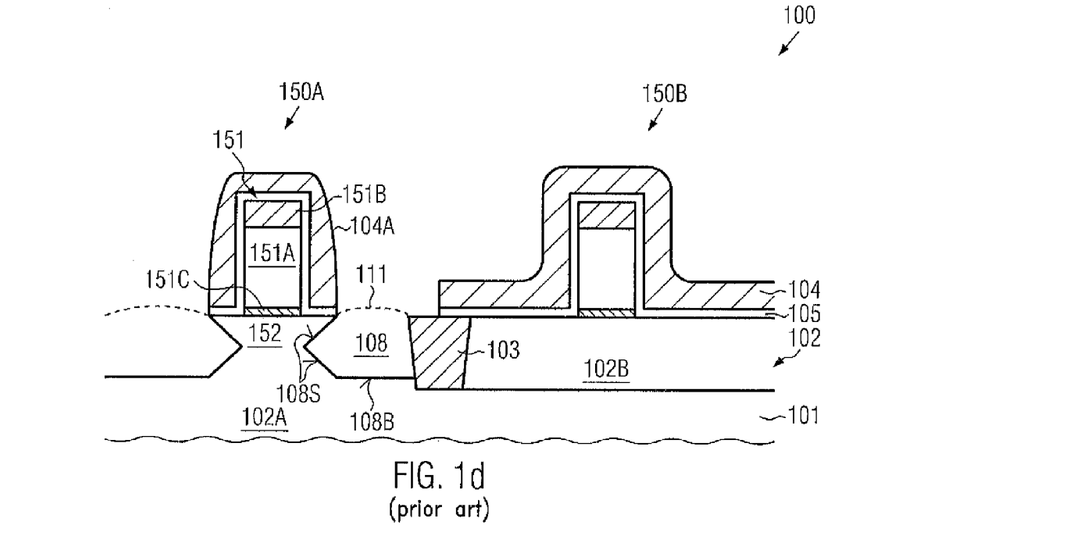
FIG. 1d schematically illustrates a cross-sectional view of the device according to conventional strategies in which cavities may be formed on the basis of a self-limiting crystallographically anisotropic etch process.

FIG. 1d schematically illustrates the semiconductor device 100 according to further conventional approaches in which the cavities 108 may be formed, at least partially, on the basis of a crystallographically anisotropic etch process, which is to be understood as an etch process in which the etch rate is different in different crystallographic orientations of the crystalline substrate material. For example, a plurality of wet etch chemistries are well known that provide a reduced removal rate with respect to the (111) crystal axis in a silicon lattice so that corresponding crystallographic planes may act as etch stop planes. Consequently, upon a crystallographically anisotropic etch chemistry, for instance based on TMAH (tetra methyl ammonium hydroxide), the cavity 108 may be shaped in a highly controllable manner, for instance after performing a first plasma-based anisotropic etch step, since, upon applying the crystallographically anisotropic etch recipe, the lateral etch rate may show a self-limiting behavior as soon as the sidewalls 108S may represent (111) planes. In this manner, a well-controllable lateral under-etching may be achieved without jeopardizing gate integrity. Thereafter, the silicon/germanium material 111 is formed in the cavities 108, as indicated by the dashed lines, on the basis of selective epitaxial growth recipes, as described above.

Generally, the offset of the material 111 from the channel region 152 may be efficiently reduced on the basis of a given width of the spacer element 104A, thereby providing a certain degree of scalability of the strain-inducing mechanism provided by the material 111. On the other hand, upon further device scaling, the non-uniformities and process fluctuations increasingly affect the performance of the device 100, for instance due to a pronounced variability of transistor characteristics and the like. For example, the degree of overgrowth of the material 111 may have an influence on the transistor characteristics since, in a later manufacturing stage, drain and source regions may have to be formed on the basis of implantation processes and metal silicide may have to be formed in the material 111, at least locally. Moreover, in some approaches, the spacers 104A may also be used for the adjustment of further transistor characteristics, such as the offset of drain and source extension regions and the like, thereby requiring further process steps for forming corresponding spacers in the transistor 150B, wherein the different process history of the resulting spacer elements may also have an influence on the further processing and the like. Moreover, a difference in overall surface topography between the transistors 150A, 150B caused by any overgrowth upon forming the silicon/germanium material 111 may increasingly contribute to device non-uniformities, for instance when forming metal silicide regions, forming contact elements which may connect to the active regions 102A, 102B and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a strain-inducing semiconductor alloy, such as a silicon/germanium alloy, may be selectively provided in one type of transistor in such a manner that a reduced lateral offset may be accomplished, while at the same time overall process non-uniformities are reduced. To this end, in some illustrative embodiments disclosed herein, the self-limiting deposition behavior of a selective epitaxial growth technique may be used for controlling the deposition process and thus the amount and hence the surface topography provided during the selective deposition of a strain-inducing semiconductor material. In some illustrative embodiments, the self-limiting deposition behavior may be used in order to form the strain-inducing semiconductor alloy also in other transistors in exposed portions of the active region without providing a cavity therein, thereby obtaining very similar topography conditions for transistors having formed therein an embedded strain-inducing material and transistor in which the semiconductor alloy is actually not required for performance enhancement. In this case, corresponding offset spacers may be formed in both types of transistors on the basis of a common manufacturing process, thereby contributing to superior uniformity of transistor characteristics, since the further processing may be continued based on spacer elements having substantially the same configuration as these spacers have experienced the same process history. Thus, during the further processing, for instance upon implanting dopant species, removing the spacers and any cap materials and the like, superior uniformity between the different types of transistors may be accomplished.

In one exemplary embodiment, a semiconductor device is disclosed that includes a first transistor positioned in and above a first semiconductor region, the first semiconductor region including a first semiconductor material and having a first upper surface. The illustrative semiconductor device further includes first raised drain and source portions positioned on the first upper surface of the first semiconductor region, the first drain and source portions including a second semiconductor material having a different material composition from the first semiconductor material. The semiconductor device additionally includes, among other things, a second transistor positioned in and above a second semiconductor region, the second semiconductor region including the first semiconductor material. Finally, the disclosed semiconductor device also includes strain-inducing regions embedded in the second semiconductor region, the embedded strain-inducing regions including the second semiconductor material.

In another illustrative embodiment disclosed herein, a semiconductor device includes, among other things, a first transistor positioned in and above a first semiconductor region having a first upper surface, wherein the first semiconductor region includes a first semiconductor material and the first transistor includes a first gate electrode structure positioned on the first upper surface. The disclosed semiconductor device also includes a second transistor positioned in and above a second semiconductor region having a second upper surface, wherein the second semiconductor region includes the first semiconductor material and the second transistor second a second gate electrode structure positioned on the second upper surface. Additionally, strain-inducing regions are embedded in the first semiconductor region and include a second semiconductor material, wherein each of the embedded strain-inducing regions has a first inclined interface and a second inclined interface, the first and second inclined interfaces forming an edge that extends along a width direction of the first transistor. The illustrative semiconductor device further includes first raised drain and source portions positioned on the embedded strain-inducing regions and extending above the first upper surface and second raised drain and source portions positioned on the second upper surface, wherein each of the first and second raised drain and source portions include the second semiconductor material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which a scaleable strain-inducing mechanism may be provided on the basis of an embedded strain-inducing semiconductor alloy, such as silicon/germanium and the like, wherein superior process uniformity may be accomplished by using self-limiting characteristics of the selective epitaxial growth process. To this end, the process parameters may be selected such that, after reliably filling appropriately shaped cavities in the transistor of interest, the further epitaxial overgrowth may result in a well-defined geometric configuration, such as a pyramidal shape, wherein any crystallographic planes may substantially suppress a further deposition of the crystalline strain-inducing semiconductor material. In still other illustrative embodiments, superior performance may be achieved by performing a common spacer formation process for transistors requiring an embedded strain-inducing semiconductor alloy and transistors not requiring the embedded strain-inducing mechanism, thereby providing superior process conditions during the further processing, wherein the selective epitaxial growth process may be applied to both types of transistors, wherein the self-limiting deposition behavior may result in a very uniform device topography for both types of transistors. Since strain-inducing semiconductor alloys may be formed on the active region of the transistor without embedding this material therein, any negative effect on the overall transistor behavior may be negligible. On the other hand, the very uniform and controllable topography of the transistors may result in superior uniformity of critical processes, such as forming metal silicides, forming contact elements connecting to the active regions, providing sophisticated gate electrode structures and the like, while at the same time ensuring a high degree of scalability of the strain-inducing mechanism based on an embedded semiconductor alloy. Consequently, the principles disclosed herein may be advantageously applied to extremely scaled semiconductor devices comprising transistors that may be formed on the basis of critical dimensions of 30 nm and less. It should be appreciated, however, that the principles disclosed herein may also be applied to less critical semiconductor devices, if appropriate.

With reference to FIGS. 2a-2l, further illustrative embodiments will now be described in more detail, wherein reference may also be made to FIGS. 1a-1d, if required.

Figure 2A:
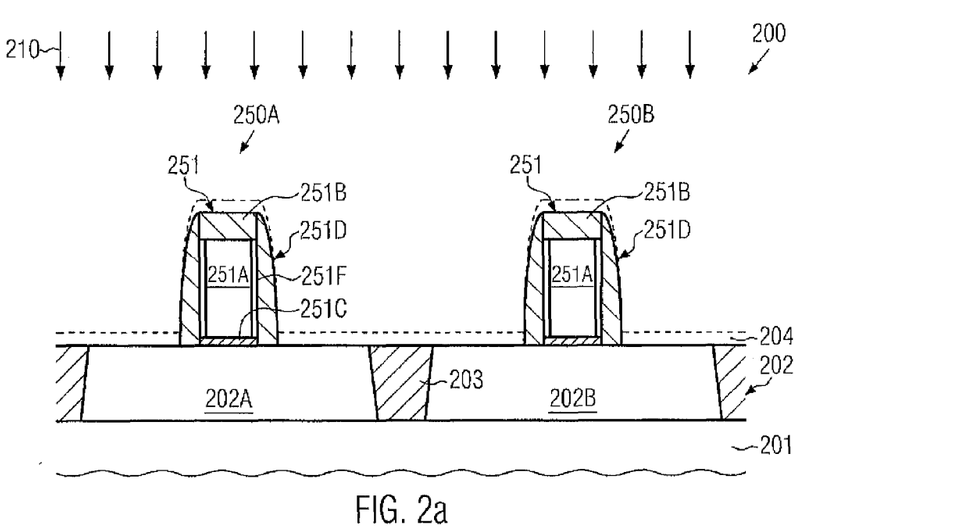
FIGS. 2a-2g schematically illustrate cross-sectional views of a semiconductor device during various manufacturing stages in which a strain-inducing semiconductor alloy may be selectively formed in one type of transistor while at the same time providing superior uniformity of transistor characteristics by using crystallographically anisotropic etch processes and self-limiting epitaxial growth techniques in combination with a superior spacer configuration according to illustrative embodiments.

FIG. 2a schematically illustrates a cross-sectional view of the semiconductor device 200 comprising a substrate 201 above which may be formed a semiconductor layer 202. The semiconductor layer 202 may, in some illustrative embodiments, be directly connected to the substrate 201, i.e., to a crystalline substrate material thereof, thereby forming a bulk configuration, while, in other cases, the semiconductor layer 202 may be separated from a crystalline substrate material by a buried insulating layer (not shown), when an SOI architecture is considered. The semiconductor layer 202 may comprise active regions 202A, 202B, which correspond to transistors 250A, 250B, respectively. The active regions 202A, 202B may be laterally delineated by an isolation structure 203. In the embodiments shown, the transistor 250A may correspond to a transistor that may require an embedded strain-inducing semiconductor alloy, while the transistor 250B may not receive an embedded semiconductor alloy. For example, the transistors 250A, 250B may represent transistors of inverse conductivity type, such as a P-channel transistor and an N-channel transistor, while, in other cases, a strain-inducing mechanism based on an embedded semiconductor alloy may not be required for the transistor 250B irrespective of its configuration and conductivity type. In the manufacturing stage shown, the transistors 250A, 250B may each comprise a gate electrode structure 251, which in turn may comprise a gate dielectric material 251C, an electrode material 251A, a cap layer 251B and a sidewall spacer structure 251D, which may comprise any appropriate elements, such as one or more spacer elements, an etch stop liner, for instance as shown in the form of a liner 251F, and the like. It should be appreciated that the gate electrode structure 251 may have any appropriate configuration, for instance in terms of sophisticated dielectric materials, which may be provided in the gate dielectric layer 251C, for instance using hafnium oxide-based materials, zirconium oxide-based materials and the like. Similarly, the electrode material 251A may include metal-containing electrode materials, semiconductor materials and the like. Furthermore, as indicated above, the gate electrode structure 251 may have a gate length, i.e., in FIG. 2a, the horizontal extension of the electrode material 251A, of approximately 30 nm and less in highly sophisticated applications.

The semiconductor device 200 as illustrated in FIG. 2a may be formed on the basis of the following processes. The active regions 202A, 202B and the isolation structure 203 may be formed in accordance with any appropriate process strategy, as is for instance also discussed above with reference to the semiconductor device 100. Thereafter, the gate electrode structures 251 may be formed based on any appropriate process strategy, which may include the provision of sophisticated material systems when high-k metal gate electrode structures are considered, in which many basic characteristics of the gate electrode structures 251 may be adjusted in an early manufacturing stage. In other cases, as will be described later on in more detail, one or more of the materials of the gate electrode structures 251 may be replaced in a very late manufacturing stage. Similarly, sophisticated lithography and patterning strategies may be applied in order to obtain the cap material 251B and the electrode material 251A in accordance with the design rules. If required, the liner 251F may be formed, for instance, by oxidation, while, in other cases, the liner material may be deposited, if required, as is also previously discussed. Thereafter, a spacer layer 204 may be formed, for instance by sophisticated low pressure CVD techniques, multi layer deposition techniques and the like, thereby providing the layer 204 with superior material characteristics and a well controlled layer thickness which, as previously discussed, may be selected such that integrity of the gate electrode structures 251 may be preserved during the further processing and also a reduced overall lateral offset may be defined for the incorporation of an embedded strain-inducing semiconductor material in the active region 202A. Thereafter, an appropriate etch process may be applied so as to form the sidewall spacer structure 251D from the spacer layer 204 for each of the transistors 250A, 250B, thereby achieving a high degree of uniformity with respect to the resulting configuration of the gate electrode structures 251. Consequently, contrary to conventional approaches, the spacer structures 251D may have substantially the same configuration for the transistors 250A, 250B.

Figure 2B:
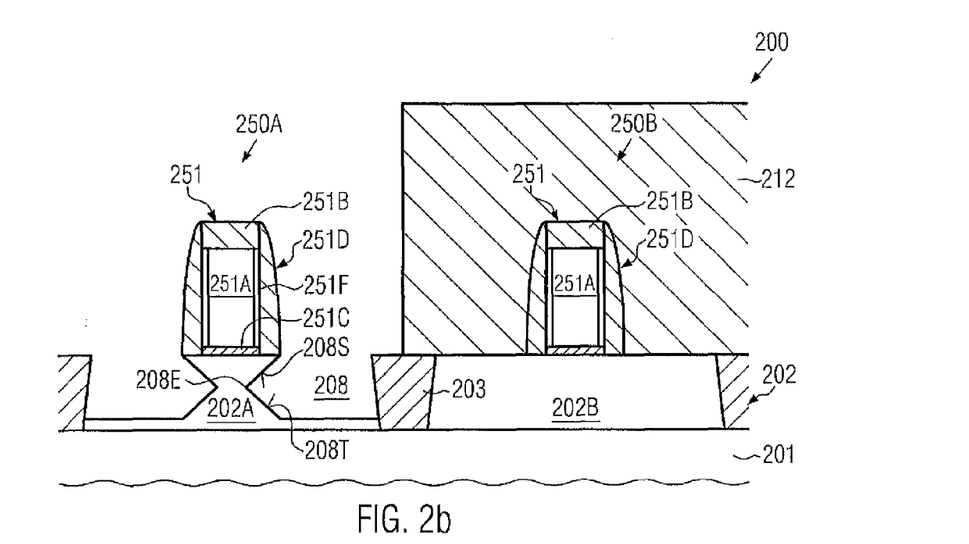

FIG. 2b schematically illustrates the semiconductor device 200 in a further advanced manufacturing stage. As illustrated, the transistor 250B may be covered by an etch mask 212, such as a resist mask and the like, while the transistor 250A may be exposed in order to form cavities 208 in the active region 202A. To this end, in some illustrative embodiments, a first etch process may be applied in the form of a plasma assisted anisotropic etch process, as is also previously explained with reference to the semiconductor device 100. Thus, a specific depth and a substantially rectangular shape of the cavities 208 may be obtained. Thereafter, a crystallographically anisotropic etch process may be performed by using TMAH or any other wet chemistry providing a crystallographically anisotropic etch behavior in order to define the final shape of the cavities 208, as shown in FIG. 2b. As previously discussed, the cavities 208 may have inclined sidewall or surface areas 208S, 208T, which may thus form an edge 208E which may extend along the transistor width direction, i.e., in FIG. 2b a direction perpendicular to the drawing plane, wherein the angle of the surfaces 208S, 208T depends on the crystallographic configuration of the active region 202A. Thus, for a given configuration of the semiconductor layer 202, a well-defined shape of the cavities 208 may be achieved, thereby also enabling a precise adjustment of the lateral offset and shape of any embedded strain-inducing semiconductor alloy to be formed in the cavities 208. After the cavity etch process, the etch mask 212, for instance provided in the form of a resist material and the like, may be efficiently removed so that the gate electrode structures 251 may still have a very similar configuration since the etch process for forming the cavities 208 may have a high selectivity with respect to the spacer structure 251D, while the etch mask 212 may also be removed without unduly affecting the gate electrode structures 251.

Figure 2C:
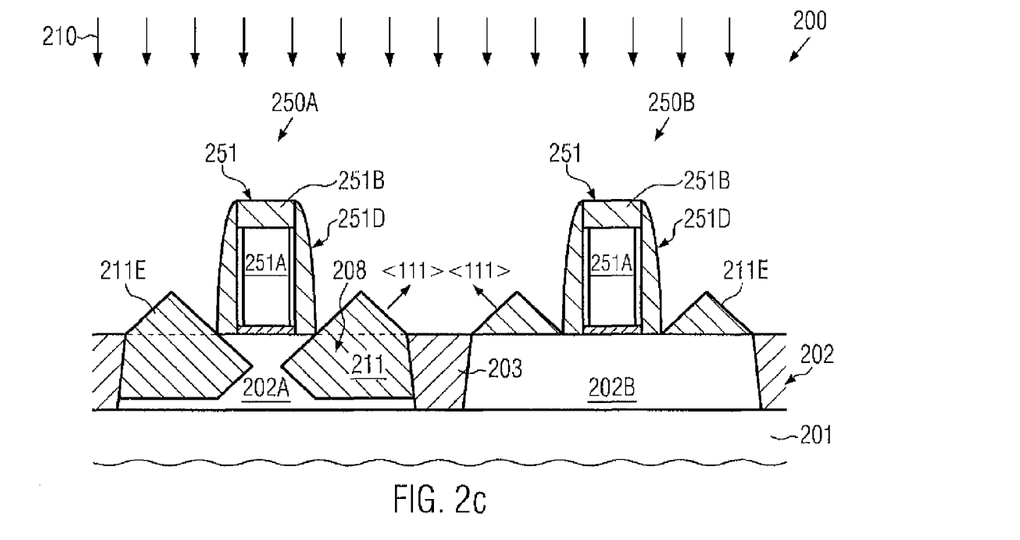

FIG. 2c schematically illustrates the semiconductor device 200 in a further advanced manufacturing stage. As illustrated, the device 200 may be subjected to a process sequence 210, which may include the selective epitaxial growth process for forming a semiconductor alloy, such as a silicon/germanium alloy, a silicon/carbon alloy and the like, as is required for enhancing performance of the transistor 250A. The process sequence 210 may comprise any appropriate process steps for preparing the device 200 for the selective epitaxial growth, which may also include the provision of any sacrificial cap materials, for instance in the form of oxide and the like, in order to provide superior stability of the cavities 208 and the like. During the selective epitaxial growth process, process parameters may be selected such that a self-limiting deposition behavior may be obtained, at least in one crystallographic orientation or axis. For example, according to well-established deposition recipes (111) crystal planes or any physically equivalent planes may not allow an efficient deposition of material, thereby acting as a deposition mask and thus providing a self-limiting deposition behavior once the deposited material forms a geometric configuration, in which these crystallographic planes are the only outer surface areas which may thus substantially completely prevent a further deposition of any further material. For example, it is well known that, for well-established selective epitaxial growth recipes for forming silicon and similar materials, such as silicon/germanium, a significant material deposition of (111) planes may be restricted. Thus, as shown in FIG. 2c, a strain-inducing semiconductor material 211 may be formed within the cavities 208, wherein the lateral offset of the material 211 may be determined on the basis of the shape of the cavities 208, as previously explained. Furthermore, during the process sequence 210, a well controlled overfill of the cavities 208 may be accomplished, thereby providing an excess portion 211E, which may comprise surface areas providing the self-limiting deposition behavior, as indicated above. For example, portions 211E may have a substantially pyramidal configuration. Consequently, the excess portions 211E may also be formed on exposed portions of the active region 202B, which may have substantially the same configuration as in the transistor 250A, as long as substantially the same geometry may be applied for the transistors 250A, 250B. Consequently, due to self-limiting deposition behavior during the process 210, the cavities 208 may be reliably filled, while the excess portions 211E may be formed on the active region 202B and thereafter the excess portions 211E may be formed on the material 211, while the deposition process 210 may be stopped on the basis of the self-limiting behavior.

Figure 2D:
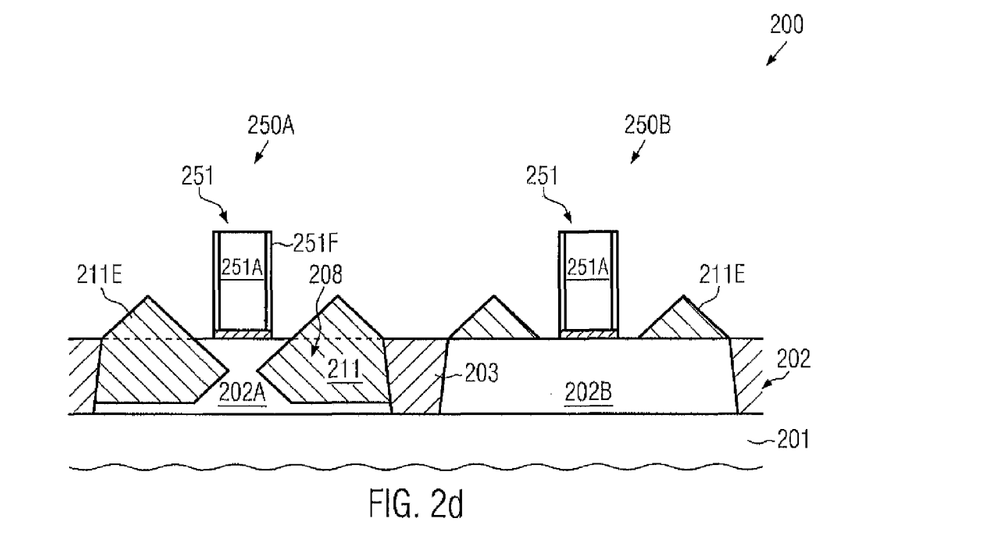

FIG. 2d schematically illustrates the semiconductor device 200 in a further advanced manufacturing stage according to some illustrative embodiments. As shown, the cap layers 251B (FIG. 2c) have been removed, possibly in combination with a portion of the spacer structure 251D (FIG. 2c), if required by the process strategy. In other cases, the spacer structure 251D may be preserved, for instance by forming any additional protective spacer elements and the like, while the cap layers 251B may be removed by any appropriate process strategy. In still other illustrative embodiments, the further processing may be continued without removing the cap layer and the sidewall spacer structure, as will be described in more detail later on. For example, any implantation processes may have been performed on the basis of the spacer structure 251D of FIG. 2c, if required, prior to the removal of the cap layer 251B, wherein, as discussed above, the high degree of similarity of the gate electrode structures 251 in terms of the spacer structure and the cap material may provide superior uniformity for the transistors 250A, 250B. Similarly, upon removing at least the cap layers 251B (FIG. 2c), very similar process conditions may be obtained for the gate electrode structures 251 of the transistors 250A, 250B, thereby also providing superior uniformity during the further processing. The removal of any materials may be accomplished on the basis of plasma assisted etch processes, for instance for removing silicon nitride material selectively with respect to silicon-based materials, silicon dioxide and the like. In other cases, well-established wet chemical etch recipes may be applied.

Figure 2E:
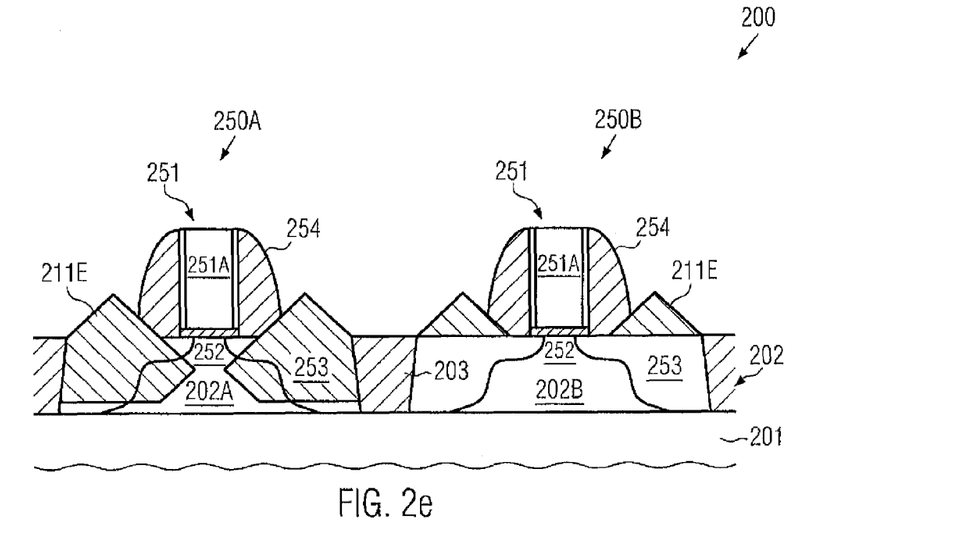

FIG. 2e schematically illustrates the semiconductor device 200 in a further advanced manufacturing stage. As shown, a spacer structure 254 may be provided on sidewalls of the gate electrode structures 251 and may be used for defining the lateral and vertical profile of drain and source regions 253 formed in the active regions 202A, 202B, respectively. It should be appreciated that the drain and source regions 253 may have inverse conductivity type when transistors 250A, 250B represent transistors of inverse conductivity type. As discussed above, during any manufacturing processes for forming the spacer structure 254, the very similar configuration of the transistors 250A, 250B, for instance in terms of surface topography, may provide a uniform process result, for instance in terms of spacer width and the like. After incorporating any dopant species, appropriate anneal processes may be applied in order to adjust the final dopant profile of the drain and source regions 253. Due to the high degree of under-etching in the active region 202A, a desired and well-controllable reduced offset of the material 211E from the channel region 252 may be realized, thereby providing superior strain conditions therein.

Figure 2F:
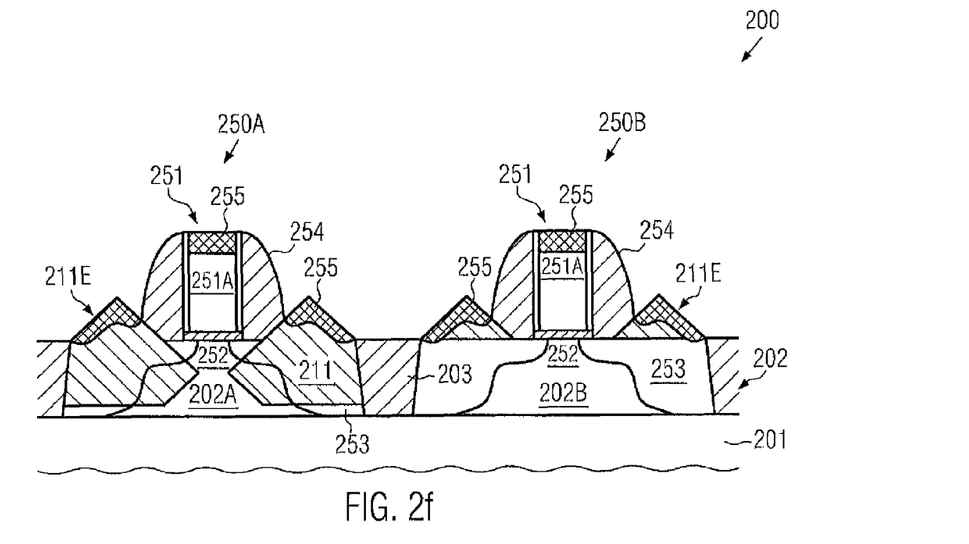

FIG. 2f schematically illustrates the semiconductor device 200 in a further advanced manufacturing stage. As shown, metal silicide portions 255 may be formed in the active regions 202A, 202B, i.e., substantially within the excess portions 211E, which may be of very similar configuration in the transistors 250A, 250B in terms of material composition and geometrical configuration. Consequently, the metal silicide regions 255 may also be formed with a high degree of uniformity for both the transistor 250A and the transistor 250B, wherein the excess portion 211E may additionally provide superior integrity of the PN junctions of the drain and source regions 253, for instance with respect to undue metal diffusion, which may frequently be observed when using nickel as a refractory metal for forming the metal silicide regions 255. Thus, any desired silicidation regime may be applied with superior uniformity. Moreover, as illustrated in FIG. 2f, the metal silicide regions 255 may also be provided in the gate electrode structures 251, when the electrode material 251A may comprise a significant amount of silicon.

Figure 2G:
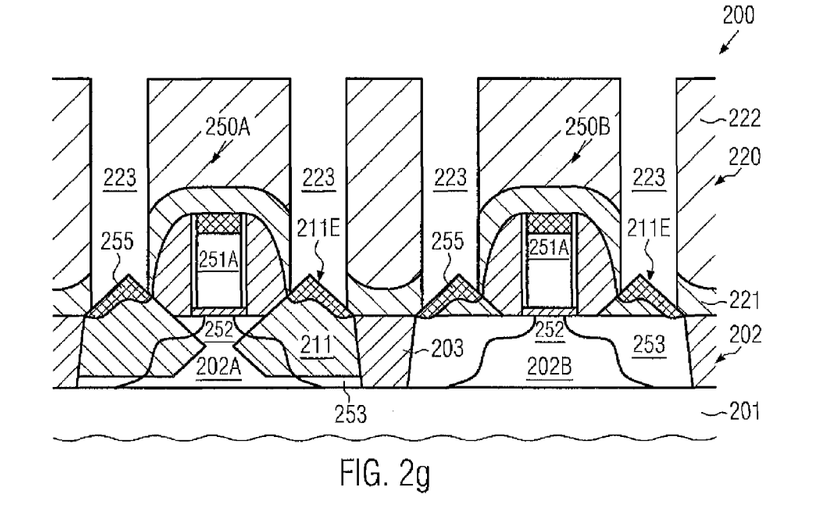

FIG. 2g schematically illustrates the semiconductor device 200 in a further advanced manufacturing stage. As illustrated, a contact level 220 may be provided in which one or more appropriate dielectric materials, such as a layer 221 and a layer 222, for instance comprised of silicon nitride, silicon dioxide and the like, may be formed so as to enclose and thus passivate the transistors 250A, 250B. To this end, any appropriate deposition regime may be applied, wherein, also in this case, the very similar surface topography may provide superior uniformity upon depositing the dielectric materials 221, 222. After planarizing the material 222, an appropriate patterning process may be applied in order to form contact openings 223, which may connect to the transistors 250A, 250B, wherein, for convenience, only contact openings are illustrated that connect the active regions 202A, 202B. In this case, the openings 223 and thus any contact elements to be formed therein may also be provided with superior uniformity, since the uniform height level may be defined by the excess portions 211E, which may also act as efficient stop areas for the corresponding etch process, thereby providing superior uniformity in terms of contact resistivity for the transistors 250A, 250B. After forming the contact openings 223, any appropriate contact metal, such as tungsten, aluminum, copper and the like, may be filled in, in combination with any appropriate barrier materials if required, in accordance with well-established process strategies.

Figure 2H:
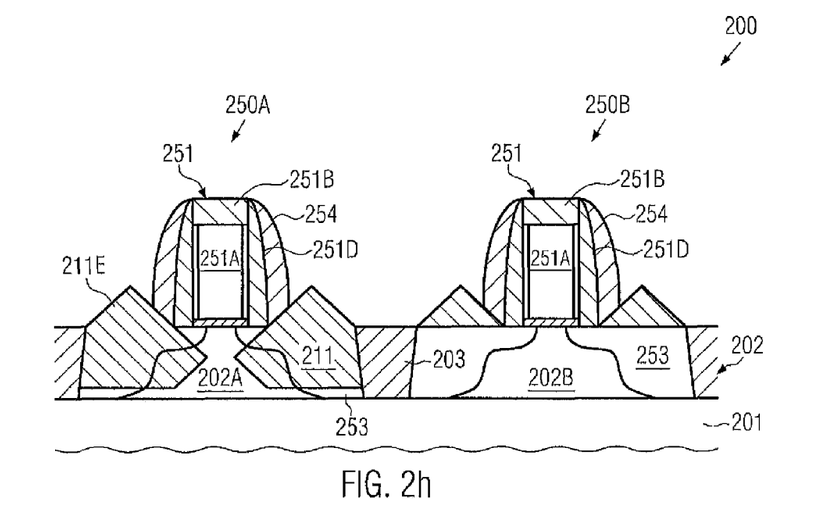
FIGS. 2h-2i schematically illustrate cross-sectional views of a semiconductor device with superior process uniformity during a replacement gate approach, according to still further illustrative embodiments.

FIG. 2h schematically illustrates the semiconductor device 200 according to other illustrative embodiments in which the spacer structure 251D and the cap layer 251B may still be in place and may be used in combination with the spacer structure 254 for forming the drain and source regions 253. Also in this case, superior uniformity with respect to any processes may be accomplished due to similar topography of the transistors 250A, 250B and due to the similar configuration of the cap layer 251B and the spacer structure 251D.

Figure 2I:
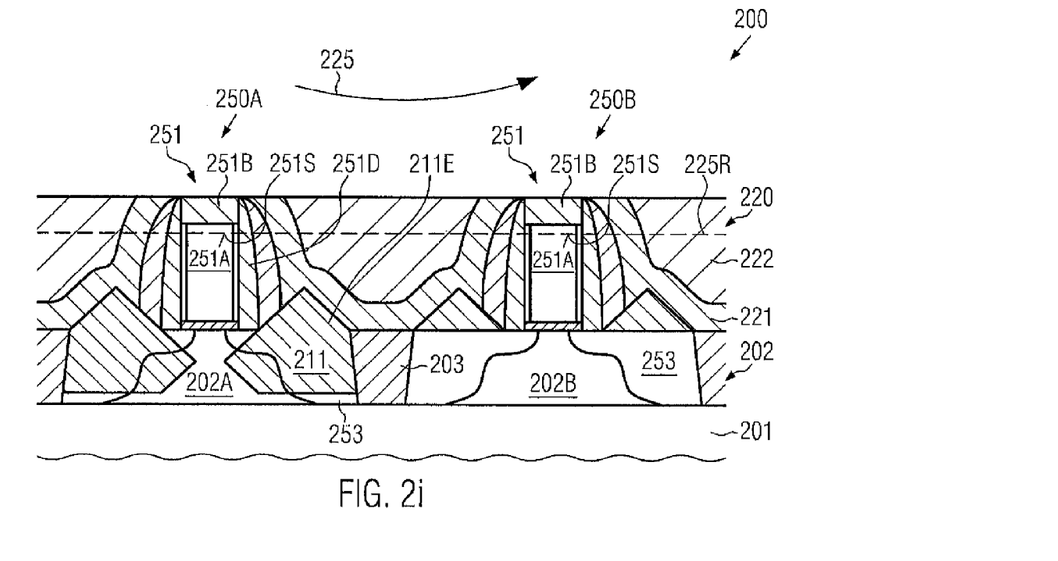

FIG. 2i schematically illustrates the semiconductor device 200 in a further advanced manufacturing stage. As illustrated, the contact level 220 may be provided, at least partially, so as to enclose the gate electrode structures 251. Moreover, a removal process 225, for instance performed on the basis of a CMP process, an etch process, or any combination thereof, may be performed to remove dielectric material of the contact level 220 so as to expose the cap layers 251D and finally to further continue the material removal, as indicated by the dashed line 225R, thereby exposing the electrode material 251A and thus forming an appropriate surface 251S. During the complex removal process 225, the superior uniformity of the cap layers 251B may thus provide superior process margins in forming or exposing the surface 251S. Consequently, in this case, the material 251A may be reliably removed on the basis of a selective etch process and any appropriate materials may be incorporated into the gate electrode structures 251, for instance in the form of a high-k dielectric material, work function adjusting metal species, highly conductive electrode metals and the like. Thereafter, further processing may be continued by completing the contact level 220 in order to form corresponding contact elements therein, wherein superior process conditions may also be achieved, as is also previously discussed. It should be appreciated that any metal silicide regions may be formed in the excess portions 211E, for instance prior to the deposition of the dielectric materials of the contact level 220, if a corresponding process strategy is compatible with the further processing. In other cases, a metal silicide may be locally formed on the basis of contact openings, such as the openings 223 as shown in FIG. 2g, after replacing any materials of the gate electrode structures 251, when respective heat treatments may not be compatible with any metal silicide materials. Also in this case, the superior conditions for forming contact openings and the similarity in device topography may provide enhanced uniformity of the resulting contact structure.

As a result, the present disclosure provides manufacturing techniques and semiconductor devices in which a strain-inducing material may be efficiently embedded in one type of active region on the basis of well-defined cavities and a self-limiting deposition process, as is described above for the transistor 250A. Furthermore, superior uniformity between different transistor types may be accomplished by forming an offset spacer structure on the basis of a common process sequence, wherein an exposure of corresponding active regions without any cavities may additionally provide superior uniformity in terms of the resulting surface topography due to the self-limiting nature of the corresponding epitaxial growth process. Consequently, a high degree of scalability of a corresponding strain-inducing mechanism may be achieved in combination with superior uniformity during the further processing, for instance when forming metal silicides, contact elements and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a first transistor positioned in and above a first semiconductor region, said first semiconductor region having a first upper surface and comprising a first semiconductor material;
   first raised drain and source portions positioned on said first upper surface of said first semiconductor region and comprising a second semiconductor material having a different material composition from said first semiconductor material, each of said first raised drain and source portions having a substantially pyramidal configuration, wherein all sides of each of said respective first raised drain and source portions meet at a common respective vertex;
   a second transistor positioned in and above a second semiconductor region, said second semiconductor region comprising said first semiconductor material; and
   strain-inducing regions embedded in said second semiconductor region and comprising said second semiconductor material.

2. The semiconductor device of claim 1, wherein said second semiconductor region has a second upper surface, the semiconductor device further comprising second raised drain and source portions positioned on said embedded strain-inducing regions, each of said second raised drain and source portions extending above said second upper surface and comprising said second semiconductor material.

3. The semiconductor device of claim 2, wherein each of said second raised drain and source portions has a substantially pyramidal configuration such that all sides of each of said respective second raised drain and source portions meet at a common respective vertex.

4. The semiconductor device of claim 2, further comprising metal silicide regions formed in said first and second raised drain and source portions.

5. The semiconductor device of claim 1, wherein said second semiconductor material is a semiconductor alloy comprising silicon and one of germanium and carbon.

6. The semiconductor device of claim 1, wherein each of said embedded strain-inducing regions comprises a first inclined interface and a second inclined interface, said first and second inclined interfaces forming an edge that extends along a width direction of said second transistor.

7. The semiconductor device of claim 1, wherein said first transistor has a first conductivity type and said second transistor has a second conductivity type that is inverse to said first conductivity type.

8. The semiconductor device of claim 1, wherein a length of a gate electrode structure of at least one of said first and second transistors is 30 nm or less.

9. The semiconductor device of claim 1, wherein a gate electrode structure of at least one of said first and second transistors is comprised of a gate dielectric layer comprising a high-k dielectric material a gate electrode comprising a conductive electrode metal.

10. A semiconductor device, comprising:
    a first transistor positioned in and above a first semiconductor region having a first upper surface, said first semiconductor region comprising a first semiconductor material and said first transistor comprising a first gate electrode structure positioned above said first upper surface;
    a second transistor positioned in and above a second semiconductor region having a second upper surface, said second semiconductor region comprising said first semiconductor material and said second transistor comprising a second gate electrode structure positioned above said second upper surface;
    strain-inducing regions embedded in said first semiconductor region and comprising a second semiconductor material, wherein each of said embedded strain-inducing regions comprises a first inclined interface and a second inclined interface, said first and second inclined interfaces forming an edge that extends along a gate width direction of said first transistor;
    first raised drain and source portions positioned on said embedded strain-inducing regions, each of said first raised drain and source portions comprising said second semiconductor material and extending above said first upper surface, wherein each upper surface of each of said first raised drain and source portions is in a (111) crystallographic plane; and second raised drain and source portions positioned on said second upper surface, each of said second raised drain and source portions comprising said second semiconductor material, wherein each upper surface of each of said second raised drain and source portions is in a (111) crystallographic plane.

11. The semiconductor device of claim 10, wherein said second semiconductor material has a different material composition from said first semiconductor material.

12. The semiconductor device of claim 11, wherein said first transistor is a PMOS transistor, said first semiconductor material comprises silicon, and said second semiconductor material is a silicon/germanium alloy.

13. The semiconductor device of claim 11, wherein said first transistor is an NMOS transistor, said first semiconductor material comprises silicon, and said second semiconductor material is a silicon/carbon alloy.

14. The semiconductor device of claim 10, wherein each of said first and second raised drain and source portions has a substantially pyramidal configuration such that all sides of each of said respective first and second raised drain and source portions meet at a common respective vertex.

15. The semiconductor device of claim 10, further comprising metal silicide regions formed in said first and second raised drain and source portions.

16. The semiconductor device of claim 10, wherein at least one of said first and second gate electrode structures comprises a high-k gate dielectric material and a conductive metal gate electrode material.

17. The semiconductor device of claim 1, wherein each surface defining each respective side of each of said respective first raised drain and source portions is in a same crystallographic plane.

18. The semiconductor device of claim 17, wherein said same crystallographic plane is a (111) crystallographic plane.

19. A semiconductor device, comprising:

a first transistor positioned in and above a first semiconductor region having a first upper surface, said first semiconductor region comprising a first semiconductor material and said first transistor comprising a first gate electrode structure positioned above said first upper surface;

a second transistor positioned in and above a second semiconductor region having a second upper surface, said second semiconductor region comprising said first semiconductor material and said second transistor comprising a second gate electrode structure positioned above said second upper surface;

strain-inducing regions embedded in said first semiconductor region and comprising a second semiconductor material, wherein each of said embedded strain-inducing regions comprises a first inclined interface and a second inclined interface, said first and second inclined interfaces forming an edge that extends along a gate width direction of said first transistor;

first raised drain and source portions positioned on said embedded strain-inducing regions, each of said first raised drain and source portions comprising said second semiconductor material and extending above said first upper surface, wherein each upper surface of each of said first raised drain and source portions is in a same first crystallographic plane and wherein each of said first raised drain and source portions has a substantially pyramidal configuration such that all sides of each of said first raised drain and source portions meet at a common respective vertex;

second raised drain and source portions positioned on said second upper surface, each of said second raised drain and source portions comprising said second semiconductor material, wherein each upper surface of each of said second raised drain and source portions is in a same second crystallographic plane and wherein each of said second raised drain and source portions has a substantially pyramidal configuration such that all sides of each of said second raised drain and source portions meet at a common respective vertex.

* * * * *